(12) United States Patent
Pelto et al.

(10) Patent No.: US 8,933,564 B2
(45) Date of Patent: Jan. 13, 2015

(54) LANDING STRUCTURE FOR THROUGH-SILICON VIA

(71) Applicants: Christopher M. Pelto, Beaverton, OR (US); Ruth A. Brain, Portland, OR (US); Kevin J. Lee, Beaverton, OR (US); Gerald S. Leatherman, Portland, OR (US)

(72) Inventors: Christopher M. Pelto, Beaverton, OR (US); Ruth A. Brain, Portland, OR (US); Kevin J. Lee, Beaverton, OR (US); Gerald S. Leatherman, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/725,917

(22) Filed: Dec. 21, 2012

(65) Prior Publication Data

US 2014/0175651 A1    Jun. 26, 2014

(51) Int. Cl.
*H01L 23/48* (2006.01)
*H01L 21/768* (2006.01)

(52) U.S. Cl.
CPC ............ *H01L 23/481* (2013.01); *H01L 21/768* (2013.01); *H01L 2224/16225* (2013.01); *H01L 2924/15311* (2013.01)
USPC ........... 257/751; 257/773; 257/686; 257/774; 438/627

(58) Field of Classification Search
USPC .......................... 257/621, 774, 751, 686, 773
See application file for complete search history.

(56) References Cited

U.S. PATENT DOCUMENTS

| 8,148,814 | B2 * | 4/2012 | Furuta et al. | 257/723 |
|---|---|---|---|---|
| 2007/0111386 | A1 * | 5/2007 | Kim et al. | 438/107 |
| 2010/0078635 | A1 * | 4/2010 | Kuroda et al. | 257/48 |
| 2010/0187671 | A1 * | 7/2010 | Lin et al. | 257/686 |
| 2010/0206737 | A1 | 8/2010 | Preisser | |
| 2010/0225002 | A1 | 9/2010 | Law et al. | |
| 2010/0230735 | A1 | 9/2010 | Zhu | |
| 2010/0276787 | A1 * | 11/2010 | Yu et al. | 257/621 |

(Continued)

FOREIGN PATENT DOCUMENTS

| KR | 10 2012 0069507 A | 6/2012 |
|---|---|---|
| KR | 1020120069507 A | 6/2012 |

OTHER PUBLICATIONS

International Application No. PCT/US2011/054428, filed Sep. 30, 2011.

(Continued)

*Primary Examiner* — Marc Armand
*Assistant Examiner* — Quinton Brasfield
(74) *Attorney, Agent, or Firm* — Schwabe, Williamson & Wyatt, P.C.

(57) ABSTRACT

Embodiments of the present disclosure describe techniques and configurations associated with forming a landing structure for a through-silicon via (TSV) using interconnect structures of interconnect layers. In eon embodiment, an apparatus includes a semiconductor substrate having a first surface and a second surface opposite to the first surface, a device layer disposed on the first surface of the semiconductor substrate, the device layer including one or more transistor devices, interconnect layers disposed on the device layer, the interconnect layers including a plurality of interconnect structures and one or more through-silicon vias disposed between the first surface and the second surface, wherein the plurality of interconnect structures include interconnect structures that are electrically coupled with the one or more TSVs and configured to provide one or more corresponding landing structures of the one or more TSVs. Other embodiments may be described and/or claimed.

27 Claims, 8 Drawing Sheets

(56) References Cited

U.S. PATENT DOCUMENTS

2011/0254165 A1* 10/2011 Muranaka .................. 257/751
2013/0161812 A1* 6/2013 Kim et al. .................. 257/737

OTHER PUBLICATIONS

International Application No. PCT/US2011/058429, filed Oct. 28, 2011.
International Application No. PCT/US2011/052016, filed Sep. 16, 2011.
International Application No. PCT/US2011/058407, filed Oct. 28, 2011.
International Search Report and Written Opinion in related PCT matter, PCT Application No. PCT/US2013/076289, mailed Apr. 28, 2014.

* cited by examiner

LANDING STRUCTURE FOR THROUGH-SILICON VIA

FIELD

Embodiments of the present disclosure generally relate to the field of integrated circuits, and more particularly, to techniques and configurations associated with forming a landing structure for a through-silicon via using interconnect layers of a die.

BACKGROUND

Integrated circuit (IC) devices such as IC dies (hereinafter "dies") and associated packaging configurations continue to shrink to smaller dimensions to accommodate mobile computing devices and other small form factor implementations. One emerging solution to couple IC devices may include the formation of through-silicon vias (TSVs) through a backside of a die to provide electrical routing through the die for another die. However, providing a landing structure for the TSVs on a frontside of the die may be challenging. For example, the TSVs may have a dimension that is much larger than a maximum dimension allowed by design rules for interconnect structures patterned in the interconnect layers of present dies. Such discrepancy in dimension of the TSVs with the dimensions of the design rules may preclude the formation of a single, contiguous landing structure that is commensurate in size with a TSV, particularly for lower interconnect layers closest to the transistors formed on the semiconductor substrate of the die where design rules are more stringent than for upper interconnect layers. Overlay and critical dimension variation in the formation of the interconnect structures may further exacerbate this challenge. It may be desirable to position the landing structure for a TSV formed from the backside of the semiconductor substrate in the interconnect layers closest to the semiconductor substrate of the die to avoid the challenges associated with penetrating multiple interconnect layers to connect to the landing structure.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

FIG. 4A schematically illustrates an example top view of a landing structure subsequent to formation of a first trench layer on a device layer, in accordance with some embodiments.

FIG. 4B schematically illustrates an example cross-section view of the landing structure of FIG. 4A, in accordance with some embodiments.

FIG. 4C schematically illustrates an example top view of the landing structure subsequent to formation of a second trench layer on the first trench layer, in accordance with some embodiments.

FIG. 4D schematically illustrates an example cross-section view of the landing structure of FIG. 4C, in accordance with some embodiments.

FIG. 4E schematically illustrates an example top view of the landing structure subsequent to formation of a first via layer on the first trench layer, in accordance with some embodiments.

FIG. 4F schematically illustrates an example cross-section view of the landing structure of FIG. 4E, in accordance with some embodiments.

FIG. 4G schematically illustrates an example cross-section view of an alternative configuration of the landing structure of FIG. 4E, in accordance with some embodiments.

FIG. 4H schematically illustrates another example cross-section view of the landing structure of FIG. 4E, in accordance with some embodiments.

FIG. 4I schematically illustrates yet another example cross-section view of the landing structure of FIG. 4E, in accordance with some embodiments.

FIG. 4J schematically illustrates still yet another example cross-section view of the landing structure of FIG. 4E, in accordance with some embodiments.

FIG. 4K schematically illustrates an example cross-section view of the landing structure subsequent to forming one or more interconnect layers on the second trench layer and removing material of the device layer to expose the landing structure, in accordance with some embodiments.

DETAILED DESCRIPTION

Figure 1:
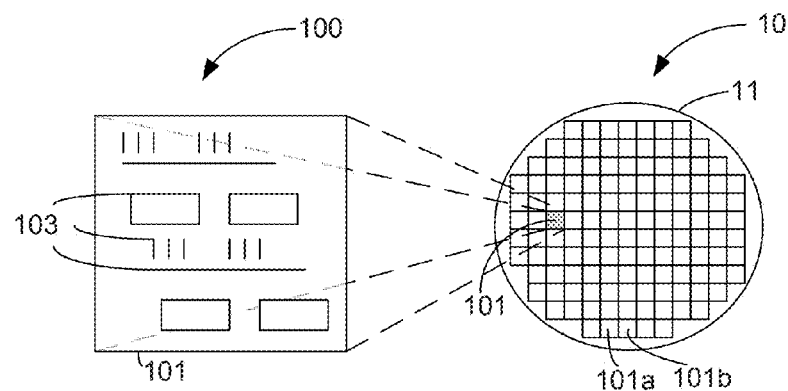
FIG. 1 schematically illustrates an example top view of a die in wafer form and in singulated form, in accordance with some embodiments.

Embodiments of the present disclosure include techniques and configurations associated with forming a landing structure (e.g., landing pad) for a through-silicon via (TSV) using interconnect layers. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, horizontal/vertical, in/out, over/under and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or elements are in direct contact.

In various embodiments, the phrase "a first feature formed, deposited, or otherwise disposed on a second feature," may mean that the first feature is formed, deposited, or disposed over the second feature, and at least a part of the first feature may be in direct contact (e.g., direct physical and/or electrical contact) or indirect contact (e.g., having one or more other feature between the first feature and the second feature) with at least a part of the second feature.

FIG. 1 schematically illustrates an example top view of an integrated circuit (IC) die (hereinafter "die 101") in wafer form 10 and in singulated form 100, in accordance with some embodiments. In some embodiments, the die 101 may be one of a plurality of dies (e.g., dies 101, 101a, 101b) of a wafer 11. The wafer 11 may include a semiconductor substrate composed of a semiconductor material such as, for example, silicon (Si) or other suitable semiconductor material. Individual dies may include circuitry 103 formed on a surface of the wafer 11. The circuitry 103 may include, for example, an active layer (e.g., active layer 202 of FIGS. 2-3) including a landing structure (e.g., landing structure 314 of FIG. 3) as described herein. Each of the dies (e.g., dies 101, 101a, 101b) may be a repeating unit of a semiconductor product that includes landing structures (e.g., landing structure 314 of FIG. 3) for through-silicon vias (e.g., through-silicon via 204a of FIG. 3) as described herein. The dies may comport with embodiments described, for example, in connection with FIGS. 2-3.

After a fabrication process of the semiconductor product is complete, the wafer 11 may undergo a singulation process in which each of the dies (e.g., die 101) is separated from one another to provide discrete "chips" of the semiconductor product. The wafer 11 may be any of a variety of sizes. In some embodiments, the wafer 11 has a diameter ranging from about 25.4 mm to about 450 mm. The wafer 11 may include other sizes and/or other shapes in other embodiments. According to various embodiments, the landing structures described herein may be part of a die 101 in wafer form 10 or singulated form 100 depending on whether the wafer 11 has been singulated or not. Landing structures as described herein may be incorporated in a die 101 for logic or memory, or combinations thereof.

Figure 2:
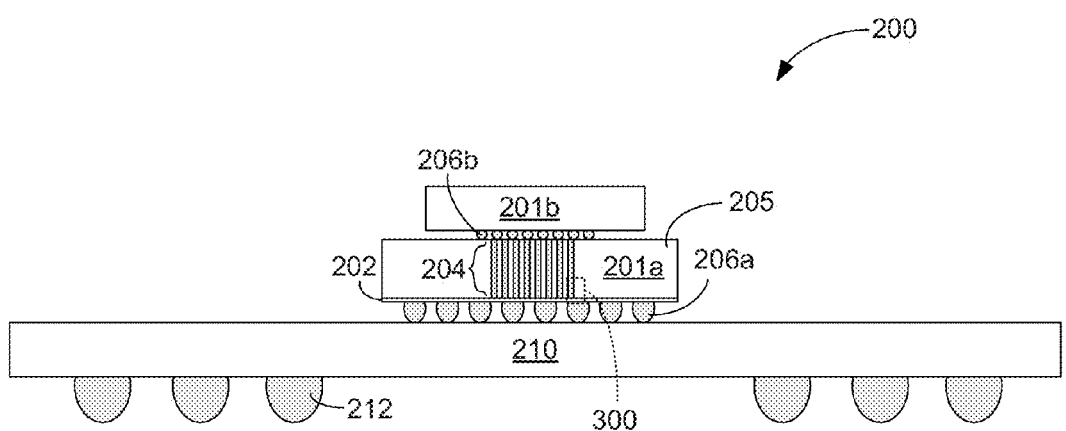
FIG. 2 schematically illustrates an example cross-section side view of an integrated circuit (IC) package assembly, in accordance with some embodiments.
Figure 3:
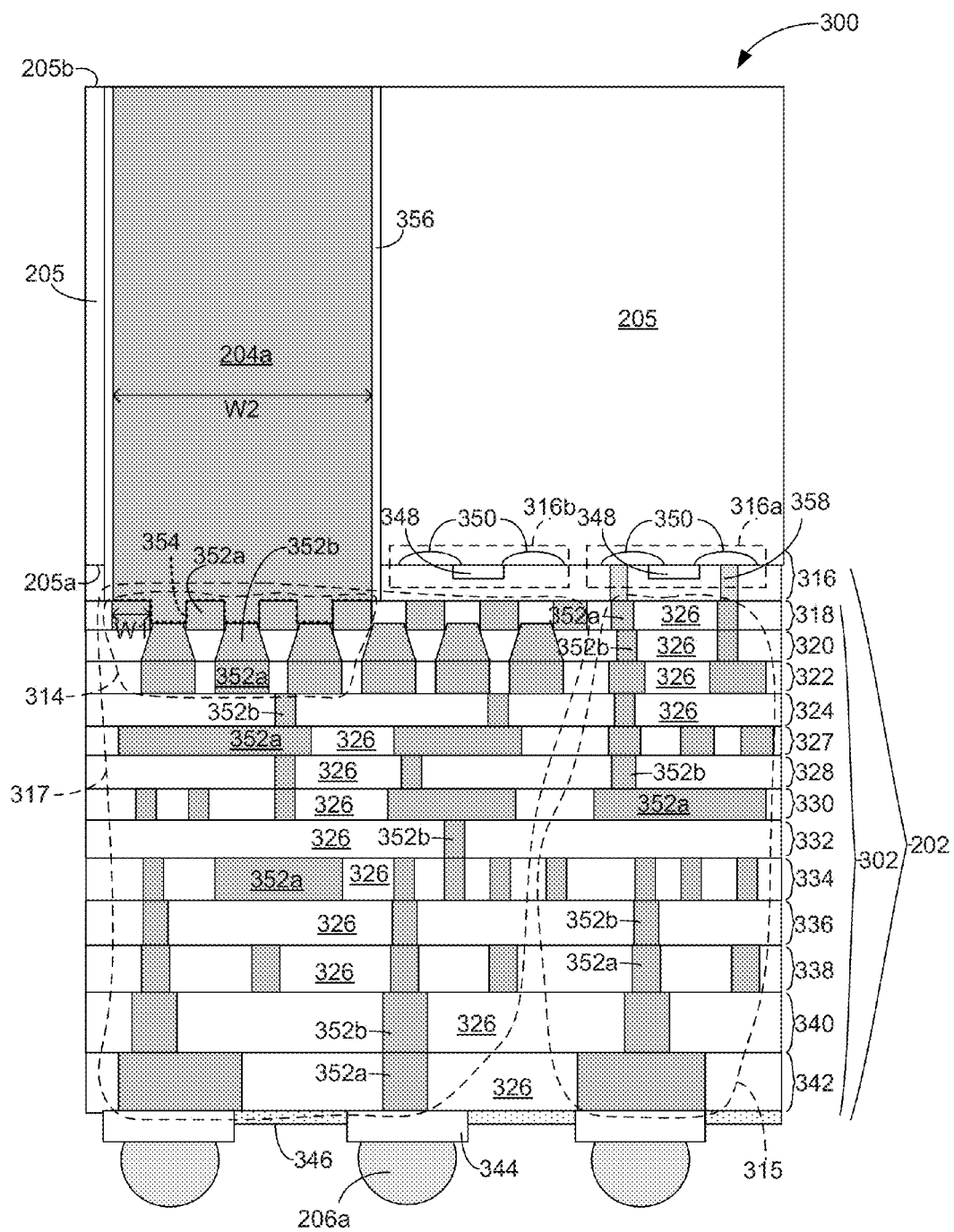
FIG. 3 schematically illustrates an example cross-section side view of a portion of a die having a landing structure for a through-silicon via (TSV), in accordance with some embodiments.

FIG. 2 schematically illustrates an example cross-section side view of an integrated circuit (IC) package assembly 200, in accordance with some embodiments. The IC package assembly 200 represents one example stacked configuration of a first die 201a coupled with a package substrate 210 using die interconnects 206a and a second die 201b coupled with the first die 201a using die interconnects 206b, according to various embodiments. FIG. 3 schematically illustrates an example cross-section side view of a portion 300 of a die having a landing structure (e.g., interconnect structures 352a, 352b indicated by 314, hereinafter "landing structure 314") for a through-silicon via (TSV) 204a, in accordance with some embodiments. For example, FIG. 3 may depict the portion 300 of the first die 201a of FIG. 2, according to various embodiments. The TSV 204a may be a TSV of one or more TSVs (hereinafter "TSVs 204") of FIG. 2.

Referring to both FIGS. 2 and 3, in some embodiments, the first die 201a may include a processor and the second die 201b may include memory. The first die 201a and/or the second die 201b may be configured to perform other functions in other embodiments. For example, in some embodiments, the first die 201a may be configured to function as memory, an application specific integrated circuit (ASIC), processor, or combinations thereof.

In the depicted configuration, the first die 201a is coupled with the package substrate 210 in a flip-chip configuration and the second die 201b is coupled with the first die 201a in a flip-chip configuration. The IC package assembly 200 is not limited to the configuration depicted in FIG. 2 and may include a wide variety of other suitable configurations in other embodiments. For example, in some embodiments additional dies may be stacked on the second die 201b and/or the first die 201a may be coupled with a component other than the package substrate 210. The IC package assembly 200 may include, for example, combinations of flip-chip and wire-bonding techniques, interposers, multi-chip package configurations including system-on-chip (SoC) and/or package-on-package (PoP) configurations to route electrical signals in some embodiments.

In some embodiments, the first die 201a may include a semiconductor substrate 205 composed of a semiconductor material. The semiconductor substrate 205 may be composed of n-type or p-type material systems and may include, for example, a crystalline substrate formed using a bulk silicon or a silicon-on-insulator substructure. In some embodiments, the semiconductor substrate 205 may be formed using alternate materials, which may or may not be combined with silicon, that include but are not limited to germanium, indium antimonide, lead telluride, indium arsenide, indium phosphide, gallium arsenide, or gallium antimonide. Other group II-VI, III-V or group IV material systems may also be used to form the semiconductor substrate 205 according to various embodiments.

The semiconductor substrate 205 may have a first surface 205a and a second surface 205b opposite to the first surface 205a, as can be seen. An active layer 202 may be formed on the first surface 205a of the semiconductor substrate 205 of the first die 201a. The active layer 202 may include, for example, a device layer 316 including transistor devices 316a, 316b and interconnect layers 302 formed on the device layer 316. Although the transistor devices 316a, 316b depict planar devices, the transistor devices 316a, 316b may include a wide variety of other configurations including multi-gate devices such as, for example, dual-gate, tri-gate, and/or gate-all-around (GAA) configurations in other embodiments.

The first surface 205a of the semiconductor substrate 205 may be referred to as a "front-side" or "active surface." The active surface may be a surface on which the transistor devices 316a, 316b are formed. The second surface 205b may be referred to as a "back-side" or "inactive surface." The active layer 202 may be referred to as "active" because the active layer 202 is formed on the active surface.

The transistor device 316a may represent one or more transistor devices that are configured to operate when the first die 201a is powered on and the dummy transistor device 316b may represent one or more dummy transistor devices that are configured to not operate when the first die 201a is powered on. The transistor device 316a and the dummy transistor device 316b may each include, for example, source/drain elements 350 and gate structures 348 configured to control flow of current between the source/drain elements 350. The transistor device 316a may further include contacts 358 (e.g., via-type structures) that are configured to provide electrical contact between interconnect layers 302 and the device layer 316. The dummy transistor device 316b may not include one or more of such contacts 358 in some embodiments. The dummy transistor devices (e.g., dummy transistor device 316b) may not be electrically connected to the landing structures (e.g., landing structure 314) in order to reduce a risk of reverse bias leakage to the semiconductor substrate 205 once the TSVs 204 (e.g., TSV 204a) are formed and electrically connected to the landing structures.

According to various embodiments, the one or more dummy transistor devices (e.g., dummy transistor device 316b) may provide dummification in the device layer 316. The dummification may be used to prevent or mitigate depopulation due to pattern design requirements. For example, in some embodiments, the TSVs 204 may be formed through the device layer 316 to connect to the landing structures (e.g., landing structure 314) and the one or more dummy transistors (e.g., dummy transistor device 316b) may provide a uniform pattern density to facilitate high quality fabrication of surrounding active transistors (e.g., transistor device 316a). The one or more dummy transistor devices (e.g., dummy transistor device 316b) may be disposed between the one or more transistor devices (e.g., transistor device 316a) and the TSVs 204 (e.g., TSV 204a). During formation of the TSVs 204, some of the dummy transistor devices (not shown) in the device layer 316 may be removed by an etching process. In other embodiments, the device layer 316 may not include dummy transistor devices (e.g., dummy transistor device 316b).

The interconnect layers 302 may include trench layers 318, 322, 327, 330, 334, 338, 342 and via layers 320, 324, 328, 332, 336, 340 arranged in an alternating configuration, as can be seen. For example, the trench layers 318, 322, 327, 330, 334, 338, 342 may include trench structures 352a (e.g., metal lines) electrically coupled together by via structures 352b (e.g., holes filled with metal) of the via layers 320, 324, 328, 332, 336, 340. The interconnect layers 302 may include electrically insulative material referred to as interlayer dielectric (ILD) 326 disposed in each of the trench layers 318, 322, 327, 330, 334, 338, 342 and the via layers 320, 324, 328, 332, 336. The ILD 326 may include, for example, oxide or nitride materials such as, for example, silicon oxide, silicon nitride, carbon-doped oxide (CDO) and the like. According to various embodiments, the trench structures 352a and/or via structures 352b may be composed of a metal such as, for example, copper. The trench structures 352a, via structures 352b and/or ILD 326 may be composed of other suitable materials in other embodiments.

The active layer 202 may further include one or more pads 344 and a passivation layer 346 formed on the interconnect layers 302. The one or more pads 344 may be electrically coupled with the trench structures 352a and via structures 352b to route electrical signals. The passivation layer 346 may be composed of a polymer such as, for example, polyimide or similar material to protect underlying components of the active layer 202 from deleterious ambient effects such as oxidation. Die interconnects 206a may be formed on the one or more bond pads 344 to further route the electrical signals.

The particular configuration of components of the IC package assembly 200 and the portion 300 is merely one example for the sake of discussion and subject matter of the present disclosure is not limited to the depicted embodiment. For example, the trench structures 352a and via structures 352b may be configured according to a wide variety of suitable circuit designs for routing of electrical signals, according to various embodiments. The interconnect layers 302 may include more or fewer trench layers and/or via layers than depicted according to various embodiments. Although each of the trench layers 318, 322, 327, 330, 334, 338, 342 and via layers 320, 324, 328, 332, 336, 340 are delineated by a boundary for ease of discussion, in some embodiments, a trench layer and adjacent via layer of the trench layers 318, 322, 327, 330, 334, 338, 342 and via layers 320, 324, 328, 332, 336, 340 may include material of the corresponding trench structures 352a and via structures 352b and/or ILD 326 that is deposited in a single operation to form a contiguous material structure. For example, in some embodiments, adjacent pairs of trench layers 318, 322, 327, 330, 334, 338, 342 and via layers 320, 324, 328, 332, 336, 340 may be formed according to dual-damascene, self-aligned via (SAV) or other suitable techniques. The size of components of the IC package assembly 200 of FIG. 2 and the portion 300 of FIG. 3 are not drawn to scale.

In some embodiments, the interconnect layers 302 may include first interconnect structures (e.g., trench structures 352a and via structures 352b indicated by 315, hereinafter "first interconnect structures 315") configured to route electrical signals to one or more transistor devices (hereinafter "transistor device 316a") of the device layer 316. For example, the first interconnect structures 315 may be configured to route the electrical signals between the transistor device 316a and electrical components external to the first die 201a. The electrical signals may be routed between the interconnect layers 302 and the package substrate 210 using die interconnects 206a. The first interconnect structures 315 may include trench structures 352a of the trench layer 318 that are not disposed at an interface 354 of the TSVs 204 (e.g., TSV 204a) and the interconnect layers 302.

Figure 6:
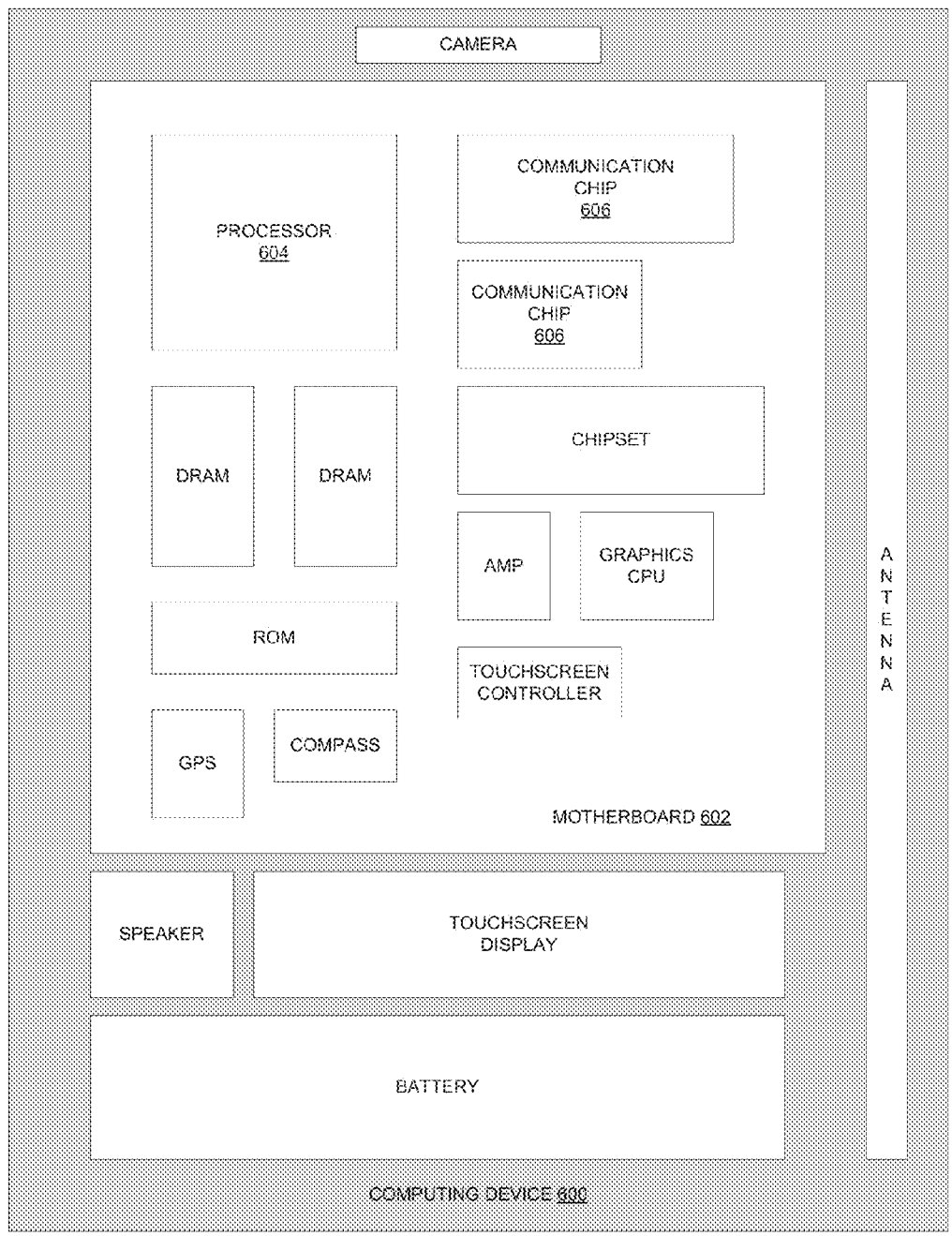
FIG. 6 schematically illustrates a computing device that may include one or more components having a landing structure described herein, in accordance with some embodiments.

In some embodiments, the IC package assembly 200 may include package interconnects 212 configured to route electrical signals between the first die 201a (and/or the second die 201b) and other electrical components external to the IC package assembly 200 including, for example, a circuit board such as a motherboard (e.g., motherboard 602 of FIG. 6). According to various embodiments, the package substrate 210 may be composed of a polymer, ceramic, glass, or semiconductor material having electrical routing features formed therein to electrically couple the die interconnects 206a and the package interconnects 212.

The interconnects 206a, 206b, 212 may include any of a wide variety of suitable structures and/or materials including, for example, bumps, pillars or balls formed using metals, alloys, solderable material, or combinations thereof. The interconnects 206a, 206b, 212 may include other suitable structures and/or materials in other embodiments.

The active layer 202 may include second interconnect structures (e.g., trench structures 352a and via structures 352b indicated by 317, hereinafter "second interconnect structures 317") configured to route electrical signals through the TSVs 204 such as, for example, TSV 204a. The TSVs 204 may be formed between opposing surfaces (e.g., first surface 205a and second surface 205b) of the semiconductor substrate 205 to electrically couple features disposed on the opposing surfaces. The term "TSV" may generally apply to a through-hole via formed in a semiconductor material of the semiconductor substrate even when the semiconductor material is composed of a material other than silicon.

According to various embodiments, a subset of the second interconnect structures 317 may be configured to provide one or more landing structures (e.g., the landing structure 314) corresponding with the TSVs 204 (e.g., TSV 204a). The second interconnect structures 317 of the landing structures (e.g., landing structure 314) may include, for example, trench structures 352a of a first trench layer (hereinafter "MT1 layer 318") that are disposed at an interface (e.g., interface 354) of the TSVs 204 (e.g., TSV 204a) and the interconnect layers 302 such as, for example, the second interconnect structures 317. The second interconnect structures 317 of the landing structures (e.g., landing structure 314) may further include via structures 352b of a first via layer (hereinafter "VA1 layer 320") that are disposed at the interface 354. As can be seen, the VA1 layer 320 may be disposed on the MT1 layer 318 and is directly adjacent to the MT1 layer 318. The MT1 layer 318 may be positioned closest to the device layer 316 relative to other trench layers (e.g., trench layers 322, 327, 330, 334, 338, 342) of the interconnect layers 302. In other embodiments, the landing structures may include trench structures 352a and via structures 352b of other trench layers and/or via layers of the interconnect layer 302. The landing structures may be placed anywhere in the stack of interconnect layer 302 where the TSVs 204 are intended to terminate and electrically couple with the second interconnect structures 317.

The trench structures 352a of the MT1 layer 318 may be configured in a pattern (e.g., a grid pattern) having regions between the trench structures 352a. The via structures 352b may be disposed, at least in part, in the regions between the trench structures 352a, as can be seen. In some embodiments, the second interconnect structures 317 of the landing structures (e.g., landing structure 314) may further include trench structures 352a of a second trench layer (hereinafter "MT2 layer 322) that are disposed directly on the via structures 352b of the VA1 layer 320, as can be seen. The MT2 layer 322 may provide a trench pattern in which via structures 352b of the VA1 layer 320 will be patterned to fill the spaces of the underlying grid in the MT1 layer 318.

The landing structures (e.g., landing structure 314) may include second interconnect structures 317 of the MT1 layer 318 and the VA1 layer 320 that are configured to provide a catch-cup structure that receives or "catches" the via etch and/or deposited material of the TSVs 204 (e.g., TSV 204a). In some embodiments, the landing structures (e.g., landing structure 314) may provide a metallic etch stop that allows a low etch rate or provides "selective" etch material to significantly slow a TSV etch process that is tuned to etch semiconductor material of the semiconductor substrate 205 and dielectric materials (e.g., ILD 326) used to form the VA1 layer 320. The interface 354 may include surfaces substantially disposed at alternating planes corresponding with the trench structures 352a and the via structures 352b of the landing structure 314 to provide a gap-tooth profile, as can be seen.

The landing structures (e.g., landing structure 314) of the active layer 202 may be configured to receive a terminating end of the TSVs 204 (e.g., TSV 204a). That is, the TSVs 204 may be configured to land on the landing structures (e.g., landing structure 314). Material of the TSVs 204 may be in direct electrical contact with material of the landing structures (e.g., landing structure 314). Such direct electrical contact may include electrical contact through a barrier layer of the TSVs 204 in some embodiments.

In some embodiments, The TSVs 204 (e.g., TSV 204a) may include a barrier material deposited to form a thin barrier layer on the trench structures 352a and via structures 352b of the landing structures (e.g., landing structure 314) at the interface 354 prior to depositing metal to fill the TSV 204a. The barrier material may include any of a wide variety of suitable materials. For example, in embodiments where the metal of the TSV 204a is copper (Cu), the barrier material may include titanium nitride (TiN), tantalum nitride (TaN), or combinations thereof. The barrier material may be electrically conductive. Other suitable barrier materials may be used in other embodiments.

In some embodiments, the barrier material may be deposited on an electrically insulative layer 356 that may be deposited on surfaces of the semiconductor substrate 205 that are disposed between metal of the TSV 204a and semiconductor material of the semiconductor substrate 205. The electrically insulative layer 356 may be composed of an oxide or nitride material such as, for example, silicon nitride (SiN) or silicon dioxide ($SiO_2$) to prevent or reduce leakage in the TSV 204a. The barrier layer, if used, may prevent or reduce diffusion of the metal of the TSV 204a. In embodiments where the electrically insulative layer 356 is not used, the barrier material may be deposited to form a layer on the surfaces of the semiconductor substrate 205 (e.g., in a configuration similar as depicted for the electrically insulative layer 356).

According to various embodiments, the second interconnect structures 317 may be configured to route electrical signals such as, for example, input/output (I/O) signals or power/ground between the TSVs 204 and the die interconnects 206a. For example, the second interconnect structures 317 may be configured to route the electrical signals between another electrical component such as, for example, the second die 201b and the package substrate 210 (e.g., by way of die interconnects 206b, TSVs 204, and die interconnects 206a). In some embodiments, the second interconnect structures 317 and the landing structures (e.g., landing structure 314) together with the TSVs 204 may be configured to route electrical signals such as, for example, I/O signals or power/ground between the one or more transistors (e.g., transistor device 316a) of the first die 201a and circuitry of the second die 201b. The first die 201a and the second die 201b may be electrically coupled to communicate or route power/ground signals through the TSVs 204 (e.g., TSV 204a) and the landing structures (e.g., landing structure 314) of the active layer 202.

In some embodiments, a width, W1, of the trench structures 352a of the MT1 layer 318 may range from 50 nanometers (nm) to 150 nm. A width, W2, of the TSVs 204 (e.g., TSV 204a) may be greater than 1 micron. In some embodiments, the width W2 may range from 5 microns to 30 microns. The widths W1 and W2 may have other suitable values in other embodiments.

In some embodiments, the TSVs 204 may be formed in a die shadow of a die (e.g., second die 201b) that is coupled or to be coupled with the first die 201a. For example, the die shadow includes a region of the first die 201a directly underlying the second die 201b. In some embodiments, the TSVs 204 may be formed in a central region of the first die 201a.

FIGS. 4A-K schematically illustrate a landing structure subsequent to various fabrication operations, in accordance with some embodiments. According to various embodiments, the landing structure may be formed by patterning multiple layers (e.g., interconnect layers 302 of FIG. 3) of a backend interconnect stack. The patterning may include, for example, lithography and/or etch processes performed on deposited dielectric (e.g., ILD 326 of FIG. 3) and/or metal materials according to well-known techniques including, for example, dual-damascene and/or SAV techniques. The SAV technique is depicted in connection with FIGS. 4A-F. According to various embodiments, the landing structure may be formed using relatively modest extensions of each layer's (e.g., MT1 layer 318, VA1 layer 320, MT2 layer 322 of FIG. 3) design rules for process compatibility (e.g., maximum process compatibility).

Figure 4A:
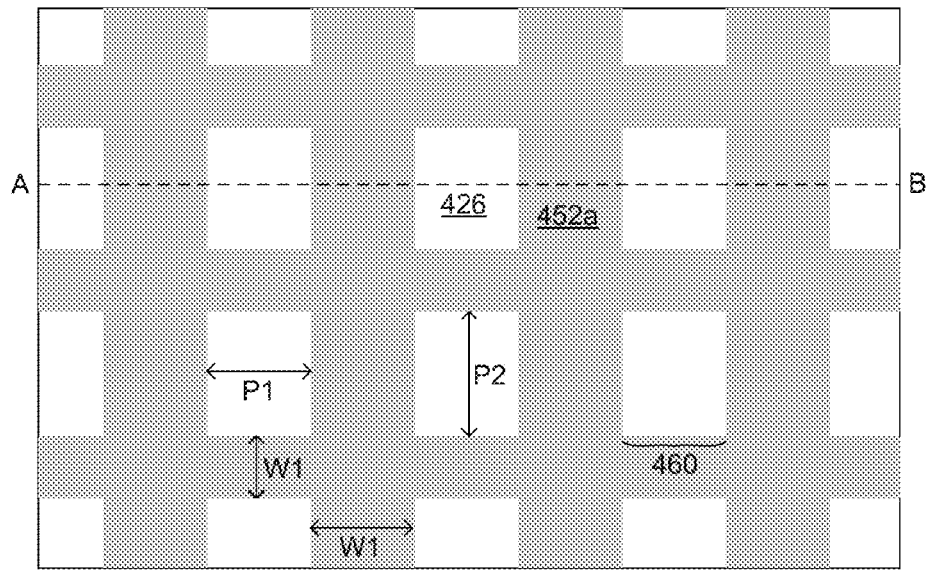
FIGS. 4A-K schematically illustrate a landing structure subsequent to various fabrication operations, in accordance with some embodiments.
Figure 4B:
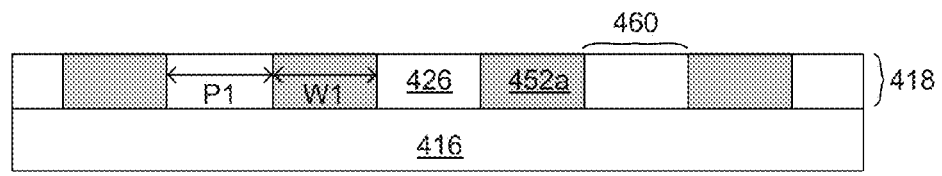

FIG. 4A schematically illustrates an example top view of a landing structure subsequent to formation of a first trench layer 418 on a device layer 416. FIG. 4B schematically illustrates an example cross-section view of the landing structure of FIG. 4A (e.g., along line AB). The device layer 416, first trench layer 418, ILD 426 and trench structures 452a may comport with embodiments described in connection with the respective device layer 316, MT1 layer 318, ILD 326 and trench structures 352a described in connection with FIG. 3.

Referring to both FIGS. 4A and 4B, material of the trench structures 452a may be deposited and/or patterned to provide the trench structures 452a in a grid configuration, as can be seen. For example, material of the ILD 326 may be deposited and patterned with trench-shaped recesses that are subsequently filled with metal of the trench structures 452a. A polishing process may be used to provide a planar surface of the first trench layer 418. The landing structure may include regions (e.g., region 460) between the trench structures 452a of the grid pattern, as can be seen.

A pitch, P1, between adjacent vertical trenches of the trench structures 452a may range from 60 nm to 300 nm. A pitch, P2, between adjacent horizontal trenches of the trench structures 452a may range from 60 nm to 300 nm. The pitches P1 and P2 may have other values in other embodiments.

Figure 4C:
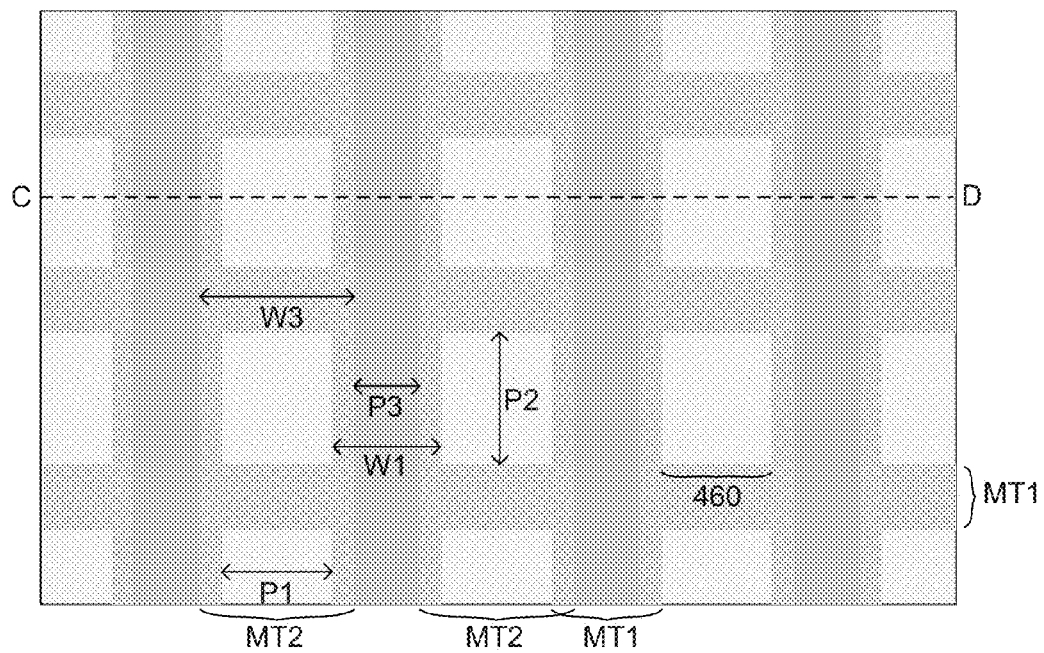
Figure 4D:
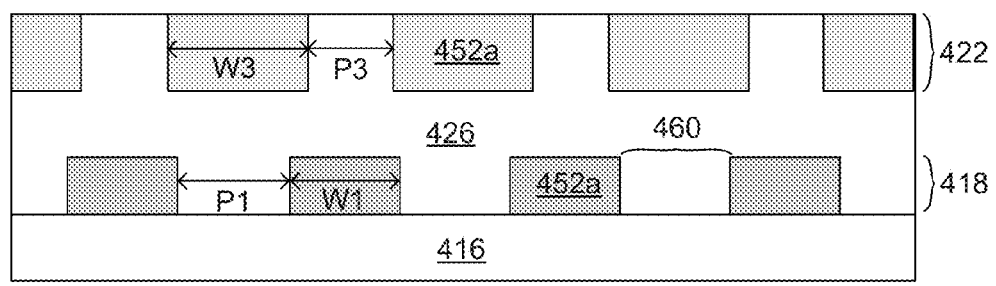

FIG. 4C schematically illustrates an example top view of the landing structure subsequent to formation of a second trench layer 422 on the first trench layer 418. FIG. 4D schematically illustrates an example cross-section view of the landing structure of FIG. 4C (e.g., along line CD). The second trench layer 422 and associated trench structures 452a may comport with embodiments described in connection with the respective MT2 layer 322 and associated trench structures 352a of FIG. 3. The ILD 426 depicted in FIG. 4D may not be depicted in the top view of FIG. 4C for the sake of clarity.

Figure 4E:
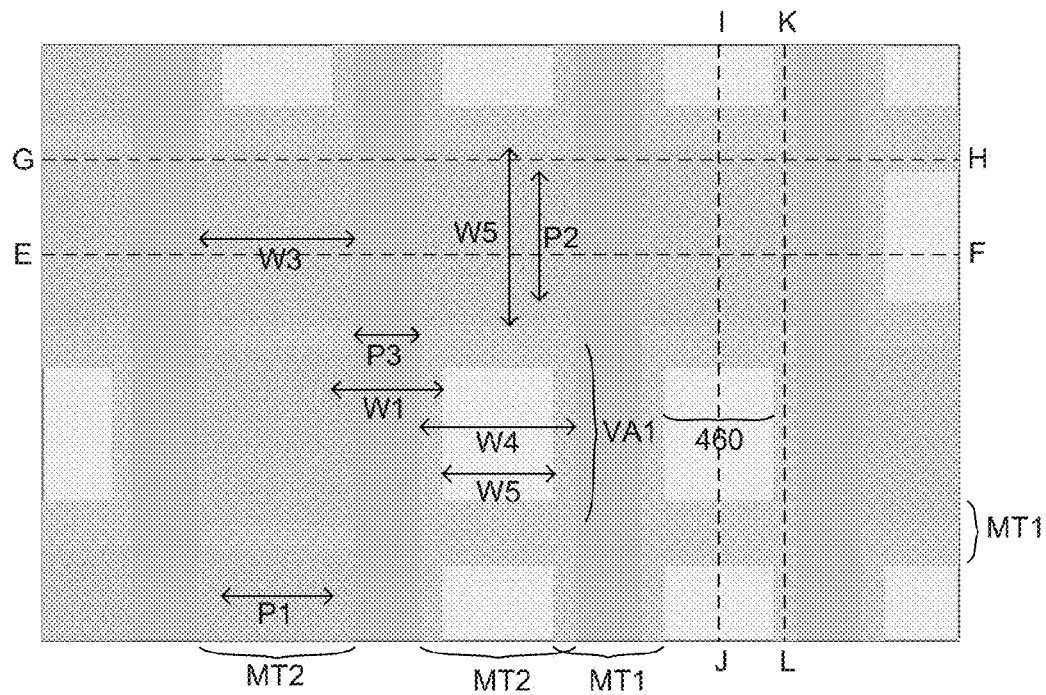
Figure 4F:
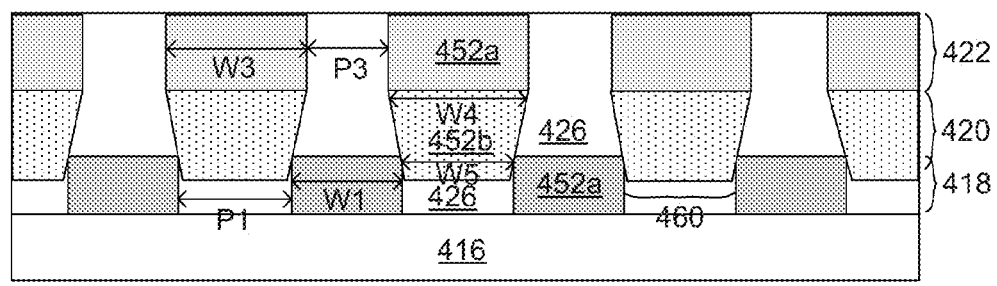

Referring to both FIGS. 4C and 4D, The second trench layer 422 may be formed in accordance with an SAV trench-first backend process flow where the second trench layer 422 is formed prior to forming a first via layer (e.g., first via layer 420 of FIGS. 4E and 4F). For example, material of the ILD 426 may be deposited on the first trench layer 418 and patterned with trench-shaped recessed that are filled with material of the trench structures 452a and polished to provide a planar surface of the second trench layer 422.

In the top view of FIG. 4C, an MT1 reference label ("MT1") is used to indicate the perpendicular trenches of the trench structures 452a of the first trench layer 418 and an MT2 reference label ("MT2") is used to indicate the parallel trenches of the trench structures 452a of the second trench layer 422. As can be seen, the trench structures 452a (e.g., MT2) of the second trench layer 422 may have a width, W3, that is greater than the width W1 of the trench structures 452a (e.g., MT1) of the first trench layer 418 such that a portion of the trench structures 452a of the second trench layer 422 overlaps the trench structures 452a of the first trench layer 418 and covers the regions (e.g., region 460) between the trench structures 452a of the first trench layer 418. According to various embodiments, a pitch, P3, between adjacent trench structures 452a of the second trench layer 422 may range from 60 nm to 300 nm. The pitch P3 may have other values in other embodiments. ILD 426 may be disposed between the trench structures 452a of the respective first trench layer 418 and the second trench layer 422.

The trench structures 452a of the respective first trench layer 418 and the second trench layer 422 may be colored differently in FIGS. 4C and 4D to more clearly depict the different layers in the top view of FIG. 4C. The trench structures 452a may be composed of a same material in some embodiments. The trench structures 452a of the second trench layer 422 may be configured to serve as a routing layer for electrical signals between a TSV (e.g., TSV 204a of FIG. 3) and other interconnect layers (e.g., interconnect layers 324, 327, 328, etc. of FIG. 3).

FIG. 4E schematically illustrates an example top view of the landing structure subsequent to formation of a first via layer 420 on the first trench layer 418. FIG. 4F schematically illustrates an example cross-section view of the landing structure of FIG. 4E (e.g., along line EF). The first via layer 420 and associated via structures 452b may comport with embodiments described in connection with the respective VA1 layer 320 and associated via structures 352b of FIG. 3. The ILD 426 may not be depicted in the top view for the sake of clarity.

Referring to both FIGS. 4E and 4F, the first via layer 420 may be formed in accordance with an SAV technique where the via structures 452 are formed after the trench structures 452a of the second trench layer 422 are patterned in the ILD 426.

In the top view of FIG. 4E, a VA1 reference label ("VA1") is used to indicate an example via structure of the via structures 452b of the first via layer 420. As can be seen, the via structures 452b (e.g., VA1) of the first via layer 420 may have a width, W4, at a top portion of the via structures 452b that is the same or similar to the width, W3, of the trench structures 452a (e.g., MT2) of the second trench layer 422 and a width, W5, at a bottom portion of the via structures 452b that is the same or less than the pitch P1 such that the bottom portion of the via structures 452b is disposed in the regions (e.g., region 460) between the trench structures 452a (e.g., MT1) of the first trench layer 418. The via structures 452b (e.g., VA1) may have a width, W5, that is greater than the pitch, P2. The via structures 452b may have circular or angular (e.g., rectangular) profiles, or combinations thereof, according to various embodiments.

The trench structures 452a of the respective first trench layer 418 and the second trench layer 422 and the via structures 452b of the first via layer 420 may be colored differently in FIGS. 4E and 4F to more clearly depict the different layers in the top view of FIG. 4E. The trench structures 452a and the via structures 452b may be composed of a same material in some embodiments.

Figure 4G:
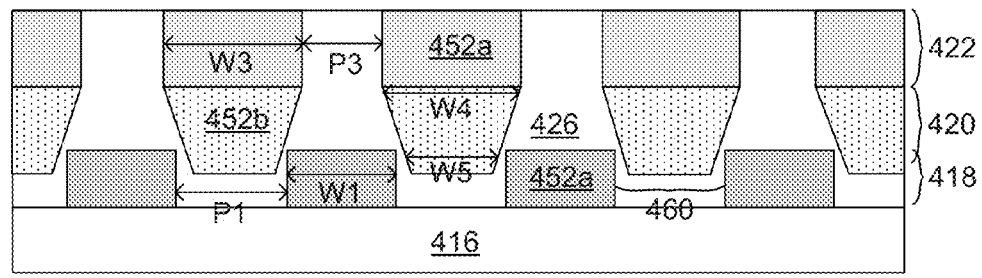

FIG. 4G schematically illustrates an example cross-section view of an alternative configuration of the landing structure of FIG. 4E (e.g., along line EF). In FIG. 4G, the width W5, of the bottom portion of the via structures 452b may be smaller than the pitch P1 such that the metal of the via structures 452b of the first via layer 420 is not in direct contact with metal of the trench structures 452a of the first trench layer 418. ILD 426 may be disposed between the via structures 452b of the first via layer 420 and the trench structures 452a of the first trench layer 418. Other embodiments may include combinations of the configurations described in connection with FIGS. 4F and 4G.

Figure 4H:
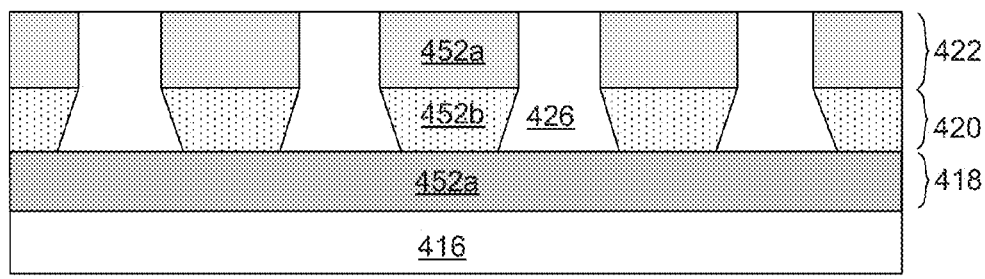

FIG. 4H schematically illustrates another example cross-section view of the landing structure of FIG. 4E (e.g., along line GH). The landing structure of FIG. 4H may comport with embodiments described in connection with FIGS. 4F and 4G. As can be seen in FIG. 4H, in the cross-section along line GH of FIG. 4E, the trench structure 452a of the first trench layer 418 may be a continuous trench structure in some embodiments. In some embodiments, a bottom portion of the via structures 452b may land (e.g., in direct contact) on the trench structures 452a of the first trench layer 418.

Figure 4I:
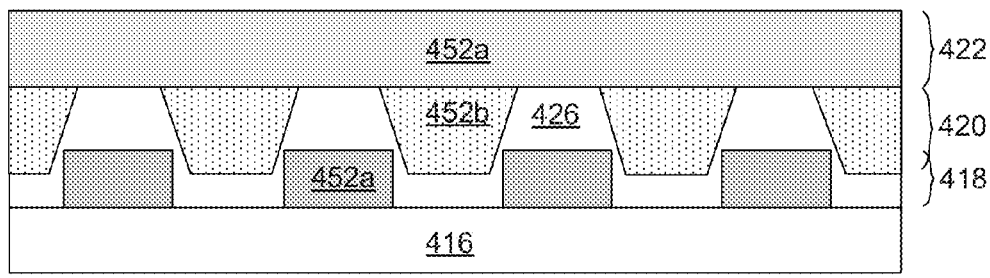

FIG. 4I schematically illustrates yet another example cross-section view of the landing structure of FIG. 4E (e.g., along line IJ). The landing structure of FIG. 4I may comport with embodiments described in connection with FIGS. 4F and 4G. As can be seen in FIG. 4I, in the cross-section along line IJ of FIG. 4E, the trench structure 452a of the second trench layer 422 may be a continuous trench structure in some embodiments. In some embodiments, a bottom portion of the via structures 452b may float between the trench structures 452a of the first trench layer 418.

Figure 4J:
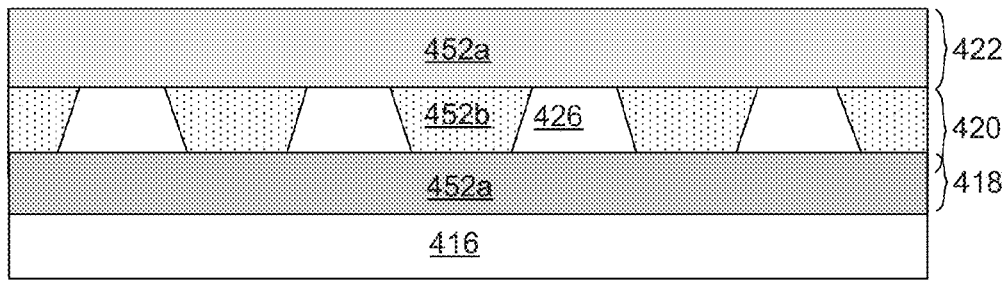

FIG. 4J schematically illustrates still yet another example cross-section view of the landing structure of FIG. 4E (e.g., along line KL). The landing structure of FIG. 4J may comport with embodiments described in connection with FIGS. 4F and 4G. As can be seen in FIG. 4J, in the cross-section along line KL of FIG. 4E, the trench structures 452a of the first trench layer 418 and the second trench layer 422 may be continuous trench structures in some embodiments. In some embodiments, a bottom portion of the via structures 452b may land (e.g., in direct contact) on the trench structures 452a of the first trench layer 418.

Figure 4K:
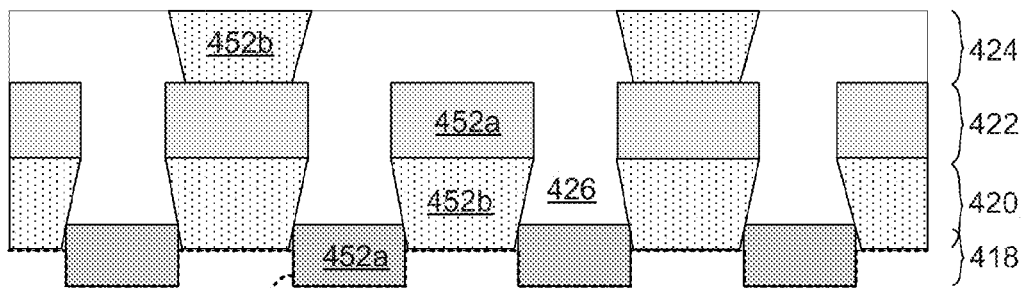

FIG. 4K schematically illustrates an example cross-section view (e.g., along line EF of FIG. 4E) of the landing structure subsequent to forming one or more interconnect layers (e.g., second via layer 424 with via structures 452a) on the second trench layer 422 and removing material of the device layer (e.g., device layer 416 of FIGS. 4E-F) to expose an interface 454 of the landing structure. Referring to FIGS. 3 and 4K, in some embodiments, TSV 204a may be formed by recessing the second surface 205b of the semiconductor substrate 205 and removing material of the device layer 316 (including dummy transistor devices in some embodiments) by etch processes to expose the interface 354, 454 of the landing structure 314. Material of the TSV 204a may be deposited in the recess formed in the second surface 205b to provide the TSV 204a. The interface 454 may comport with embodiments described in connection with the interface 354.

Figure 5:
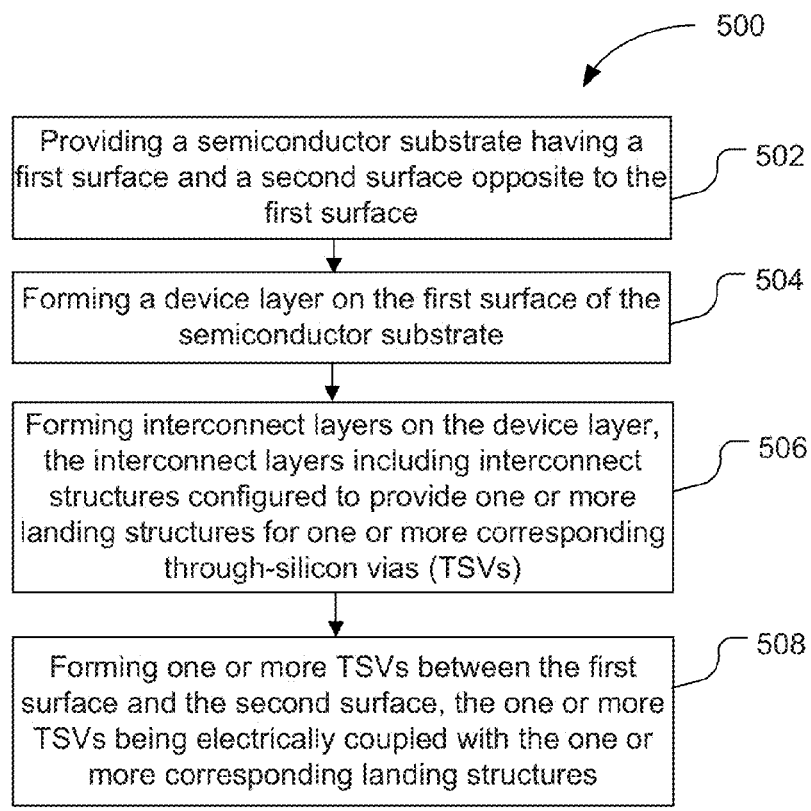
FIG. 5 is a flow diagram for a method of fabricating a die having a landing structure for a TSV, in accordance with some embodiments.

FIG. 5 is a flow diagram for a method 500 of fabricating a die (e.g., first die 201a of FIG. 2) having a landing structure (e.g., landing structure 314 of FIG. 3) for a TSV (e.g., TSV 204a of FIG. 3), in accordance with some embodiments. Multiple landing structures for corresponding multiple TSVs may be formed using similar techniques. The method 500 may comport with techniques described in connection with FIGS. 1 through 4K and vice versa.

At 502, the method 500 may include providing a semiconductor substrate (e.g., semiconductor substrate 205 of FIG. 3) having a first surface (e.g., first surface 205a of FIG. 3) and a second surface (e.g., second surface 205b of FIG. 3) opposite to the first surface.

At 504, the method 500 may include forming a device layer (e.g., device layer 316 of FIG. 3) including one or more transistor devices (e.g., transistor device 316a of FIG. 3). In some embodiments forming the device layer may further include forming one or more dummy transistor devices (e.g., dummy transistor device 316b of FIG. 3) in a region where one or more TSVs (e.g., TSV 204a of FIG. 3) are to be formed.

At 506, the method 500 may include forming interconnect layers (e.g., interconnect layers 302 of FIG. 3) on the device layer, the interconnect layers including interconnect structures (e.g., second interconnect structures 317 of FIG. 3) configured to provide one or more landing structures (e.g., landing structure 314 of FIG. 3) for one or more corresponding TSVs (e.g., TSV 204a of FIG. 3). Forming the interconnect layers may further include forming interconnect structures (e.g., first interconnect structures 315 of FIG. 3) that are configured to route electrical signals to the one or more transistor devices (e.g., transistor device 316a of FIG. 3). The second interconnect structures may be formed by forming a first trench layer (e.g., MT1 layer 318 of FIG. 3) on the device layer, the first trench layer including trench structures (e.g., trench structures 352a of FIG. 3) configured in a grid pattern having regions between the trench structures and forming a first via layer (e.g., VA1 layer 320) on the first trench layer, the first via layer including via structures (e.g., via structures 352b of FIG. 3) at least partially disposed in the regions between the trench structures.

Forming the second interconnect structures may further include forming a second trench layer (e.g., MT2 layer 322 of FIG. 3) on the first via layer. The second trench layer may include trench structures disposed on the via structures of the first via layer. The second interconnect structures may be formed using any suitable technique, including, for example, well-known dual-damascene or SAV processes. In some embodiments, the first interconnect structures may be formed as part of a same process used to form the second interconnect structures (e.g., same deposition, etch, and/or lithography operations).

At 508, the method 500 may further include forming one or more TSVs (e.g., TSV 204a of FIG. 3) between the first surface and the second surface, the one or more TSVs being electrically coupled with the one or more corresponding landing structures. In some embodiments, forming the one or more TSVs includes removing material of the semiconductor substrate (e.g., through the second surface of the semiconductor substrate) and the device layer to form an opening that exposes the one or more landing structures. The material of the semiconductor substrate and the device layer (e.g., including dummy transistor device in some embodiments) may be removed using any suitable well-known etch processes. Removal of the material of the semiconductor substrate may expose an interface (e.g., interface 354 of FIG. 3) of the landing structures. An electrically conductive material may be deposited using any suitable technique to fill the opening and provide an electrical pathway to the landing structures from the second surface of the semiconductor substrate.

In some embodiments forming the one or more TSVs may further include forming an electrically insulative layer (e.g., electrically insulative layer 356 of FIG. 3) on surfaces of the semiconductor substrate in the opening prior to depositing the electrically conductive material. In some embodiments, forming the one or more TSVs may further include forming a barrier layer on the electrically insulative layer and/or the one or more landing structures (e.g., on the interface) prior to depositing the electrically conductive material. In some embodiments, forming the barrier layer may be performed subsequent to forming the electrically insulative layer.

Various operations are described as multiple discrete operations in turn, in a manner that is most helpful in understanding the claimed subject matter. However, the order of description should not be construed as to imply that these operations are necessarily order dependent. Embodiments of the present disclosure may be implemented into a system (e.g., a computing device) using any suitable hardware and/or software to configure as desired. FIG. 6 schematically illustrates a computing device 600 that may include one or more components (e.g., first die 201a) having a landing structure (e.g., landing structure 314 of FIG. 3) described herein, in accordance with some embodiments. The computing device 600 may house a board such as motherboard 602. The motherboard 602 may include a number of components, including but not limited to a processor 604 and at least one communication chip 606. The processor 604 may be physically and electrically coupled to the motherboard 602. In some implementations, the at least one communication chip 606 may also be physically and electrically coupled to the motherboard 602. In further implementations, the communication chip 606 may be part of the processor 604.

Depending on its applications, computing device 600 may include other components that may or may not be physically and electrically coupled to the motherboard 602. These other components may include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, a camera, and a mass storage device (such as hard disk drive, compact disk (CD), digital versatile disk (DVD), and so forth).

The communication chip 606 may enable wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible BWA networks are generally referred to as WiMAX networks, an acronym that stands for Worldwide Interoperability for Microwave Access, which is a certification mark for products that pass conformity and interoperability tests for the IEEE 802.16 standards. The communication chip 606 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 606 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 606 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 606 may operate in accordance with other wireless protocols in other embodiments.

The computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

The processor 604 of the computing device 600 may include a die (e.g., first die 201a of FIG. 2) or IC package assembly (e.g., IC package assembly 200 of FIG. 2) having one or more landing structures (e.g., landing structure 314 of FIG. 3) as described herein. For example, the processor 604 may include a die (e.g., first die 201a of FIG. 2) embodied in a package assembly (e.g., IC package assembly 200 of FIG. 3) that is mounted on the motherboard 602. The term "processor" may refer to any device or portion of a device that processes electronic data from registers and/or memory to transform that electronic data into other electronic data that may be stored in registers and/or memory.

The communication chip 606 may also include a die (e.g., first die 201a of FIG. 2) embodied in a package assembly (e.g., IC package assembly 200 of FIG. 2). In further implementations, another component (e.g., memory device or other integrated circuit device) housed within the computing device 600 may (e.g., first die 201a of FIG. 2) embodied in a package assembly (e.g., IC package assembly 200 of FIG. 2).

In various implementations, the computing device 600 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 600 may be any other electronic device that processes data.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

What is claimed is:
1. An apparatus comprising:
 a semiconductor substrate having a first surface and a second surface opposite to the first surface;
 a device layer disposed on the first surface of the semiconductor substrate, the device layer including one or more transistor devices;

interconnect layers disposed on the device layer, the interconnect layers including a plurality of interconnect structures; and
one or more through-silicon vias (TSVs) disposed between the first surface and the second surface, wherein the plurality of interconnect structures include
first interconnect structures that are configured to route electrical signals to the one or more transistor devices, and
second interconnect structures that are electrically coupled with the one or more TSVs and configured to provide one or more corresponding landing structures for the one or more TSVs, wherein the second interconnect structures include:
trench structures of a first trench layer (MT1) that are disposed at an interface of the one or more TSVs and at least some of the second interconnect structures; and
via structures of a first via layer (VA1) that are disposed at the interface, the VA1 layer being disposed on the MT1 layer.

2. The apparatus of claim 1, wherein:
the trench structures are configured in a grid pattern having regions between the trench structures; and
the via structures are at least partially disposed in the regions between the trench structures.

3. The apparatus of claim 1, wherein:
a width of the trench structures is from 50 nanometers (nm) to 150 nm; and
a width of each of the one or more TSVs is greater than 1000 nm.

4. The apparatus of claim 1, wherein the second interconnect structures further include:
trench structures of a second trench layer (MT2) that are disposed on the via structures of the VA1 layer, the second trench layer being disposed on the VA1 layer.

5. The apparatus of claim 1, wherein the first interconnect structures include trench structures of the MT1 layer that are not disposed at the interface.

6. The apparatus of claim 1, wherein the MT1 layer is positioned closest to the device layer relative to other trench layers of the interconnect layers.

7. The apparatus of claim 1, wherein the device layer includes one or more dummy transistor devices disposed between the one or more transistor devices and the one or more TSVs.

8. The apparatus of claim 1, wherein:
the first interconnect structures and the second interconnect structures comprise copper (Cu);
the one or more TSVs comprise Cu; and
the semiconductor substrate comprises silicon (Si).

9. The apparatus of claim 8, further comprising:
an electrically insulative layer disposed between the Cu of the one or more TSVs and the Si of the semiconductor substrate.

10. A method comprising:
providing a semiconductor substrate having a first surface and a second surface opposite to the first surface;
forming a device layer on the first surface of the semiconductor substrate, the device layer including one or more transistor devices;
forming interconnect layers on the device layer including first interconnect structures that are configured to route electrical signals to the one or more transistor devices and second interconnect structures that are configured to provide one or more landing structures for one or more corresponding through-silicon vias (TSVs); and
forming one or more through-silicon vias (TSVs) between the first surface and the second surface, wherein the second interconnect structures are electrically coupled with the one or more TSVs and include:
trench structures of a first trench layer (MT1) that are disposed at an interface of the one or more TSVs and at least some of the second interconnect structures; and
via structures of a first via layer (VA1) that are disposed at the interface, the VA1 layer being disposed on the MT1 layer.

11. The method of claim 10, wherein forming the device layer comprises:
forming one or more dummy transistor devices in a region where the one or more TSVs are to be formed.

12. The method of claim 10, wherein
the trench structures are configured in a grid pattern having regions between the trench structures; and
the via structures are at least partially disposed in the regions between the trench structures.

13. The method of claim 10 further comprising:
forming a second trench layer (MT2) on the VA1 layer, wherein the MT2 layer includes trench structures disposed on the via structures of the VA1 layer.

14. The method of claim 10, wherein the second interconnect structures are formed using a dual-damascene or self-aligned via (SAV) process.

15. The method of claim 10, wherein the MT1 layer is positioned closest to the device layer relative to other trench layers of the interconnect layers.

16. The method of claim 10, wherein forming the one or more TSVs comprises:
removing material of the semiconductor substrate and the device layer to form an opening that exposes the one or more landing structures; and
depositing an electrically conductive material to fill the opening and provide an electrical pathway to the landing structures from the second surface of the semiconductor substrate.

17. The method of claim 16, wherein forming the one or more TSVs further comprises:
forming an electrically insulative layer on surfaces of the semiconductor substrate in the opening prior to depositing the electrically conductive material.

18. A system comprising:
a first die including:
a semiconductor substrate having a first surface and a second surface opposite to the first surface;
a device layer disposed on the first surface of the semiconductor substrate, the device layer including one or more transistor devices;
interconnect layers disposed on the device layer, the interconnect layers including a plurality of interconnect structures; and
one or more through-silicon vias (TSVs) disposed between the first surface and the second surface, wherein the plurality of interconnect structures include
first interconnect structures that are configured to route electrical signals to the one or more transistor devices, and
second interconnect structures that are electrically coupled with the one or more TSVs and configured to provide one or more corresponding landing structures for the one or more TSVs; and
a second die electrically coupled with the first die through the one or more TSVs, wherein the second interconnect structures include:
   trench structures of a first trench layer (MT1) that are disposed at an interface of the one or more TSVs and the second interconnect structures, and
   via structures of a first via layer (VA1) that are disposed at the interface, the VA1 layer being disposed on the first trench layer.

19. The system of claim 18, wherein the one or more TSVs are configured to route input/output (I/O) signals between the first die and the second die.

20. The system of claim 18, wherein the one or more TSVs are disposed in a central region of the first die.

21. The system of claim 18, wherein the system is one of a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder.

22. The system of claim 21, further comprising one or more of an antenna, a display, a touchscreen display, a touchscreen controller, a battery, an audio codec, a video codec, a power amplifier, a global positioning system (GPS) device, a compass, an accelerometer, a gyroscope, a speaker, a camera, or a mass storage device operatively coupled with the first die or the second die.

23. The system of claim 18, further comprising:
   a package substrate, wherein the first die and the second die are mounted in a stacked configuration on the package substrate.

24. The system of claim 23, further comprising:
   a circuit board, wherein the package substrate is electrically coupled with the circuit board and wherein the one or more TSVs are configured to route electrical signals between the second die and the circuit board.

25. The system of claim 23, wherein:
   the first die is coupled with the package substrate in a flip-chip configuration;
   the second die is coupled with the first die in a flip-chip configuration; and
   the one or more TSVs are configured to route electrical signals between the second die and the package substrate.

26. The system of claim 25, wherein the electrical signals include input/output (I/O) signals and/or power/ground.

27. The system of claim 25, wherein the first die is a processor and the second die is memory.

\* \* \* \* \*